United States Patent
Xu et al.

(10) Patent No.: US 7,820,540 B2
(45) Date of Patent: Oct. 26, 2010

(54) METALLIZATION CONTACT STRUCTURES AND METHODS FOR FORMING MULTIPLE-LAYER ELECTRODE STRUCTURES FOR SILICON SOLAR CELLS

(75) Inventors: Baomin Xu, San Jose, CA (US); David K. Fork, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 12 days.

(21) Appl. No.: 11/962,987

(22) Filed: Dec. 21, 2007

(65) Prior Publication Data

US 2009/0162972 A1    Jun. 25, 2009

(51) Int. Cl.
*H01L 21/44* (2006.01)

(52) U.S. Cl. .................. 438/597; 438/572; 438/573; 438/584; 438/613; 257/E21.411; 257/E21.413

(58) Field of Classification Search .................. None
See application file for complete search history.

(56) References Cited

U.S. PATENT DOCUMENTS

| | | | |
|---|---|---|---|
| 4,235,644 A | 11/1980 | Needes | |
| 6,284,562 B1* | 9/2001 | Batlogg et al. | 438/99 |
| 6,814,795 B2 | 11/2004 | McVicker et al. | |
| 7,061,570 B2* | 6/2006 | Imai | 349/187 |
| 2002/0109149 A1* | 8/2002 | Chang | 257/98 |
| 2004/0200520 A1 | 10/2004 | Mulligan et al. | |
| 2005/0022862 A1 | 2/2005 | Cudzinovic et al. | |
| 2006/0102228 A1 | 5/2006 | Sridharan et al. | |
| 2007/0169806 A1 | 7/2007 | Fork et al. | |
| 2007/0221887 A1* | 9/2007 | Kodas et al. | 252/500 |
| 2007/0287237 A1* | 12/2007 | Rockenberger et al. | 438/163 |
| 2008/0011350 A1* | 1/2008 | Luch | 136/249 |
| 2008/0303037 A1* | 12/2008 | Irving et al. | 257/88 |

OTHER PUBLICATIONS

S.M. Sze "Semiconductor Devices. Physics and Technology. 2nd Edition", (c) Wiley and Sons, 2002, chapter 9, figs. 41 and 42.*
"Handbook of Photovoltaic Science and Engineering", ed. Luque et al., (c) Wiley and Sons, 2002, p. 288.*

(Continued)

*Primary Examiner*—N Drew Richards
*Assistant Examiner*—Kyoung Lee
(74) *Attorney, Agent, or Firm*—Oliff & Berridge, PLC (57) ABSTRACT

Metallization contact structures and methods for forming a multiple-layer electrode structure on solar cells include depositing a conductive contact layer on a semiconductor substrate and depositing a metal bearing ink onto a portion of the conductive contact layer, wherein exposed portions of the conductive contact layer are adjacent to the metal bearing ink. The conductive contact layer is patterned by removing exposed portions of the conductive contact layer from the semiconductor substrate. The metal bearing ink is aligned with openings in a dielectric layer of the semiconductor substrate and with unexposed portions of the conductive contact layer. The unexposed portions of the conductive contact layer are interposed between the metal bearing ink and the dielectric layer such that the conductive contact layer pattern is aligned with metal bearing ink. The semiconductor substrate is thermally processed to form a current carrying metal gridline by sintering the metal bearing ink.

36 Claims, 5 Drawing Sheets

OTHER PUBLICATIONS

"Handbook of Thin-Film Deposition Processes and Techniques—Principles, Methods, Equipment and Applications, 2nd Edition", ed. by Kern et al., (c) William Andrew Publishing/Noyes, 2002, chapter 2, p. 13.*

S.M Sze. "Semiconductor Devices. Physics and Technology", 2nd edition, (C) 2002 John Wiley and Sons, chapter 9, figs. 41 and 42.*

"Handbook of Photovoltaic Science and Engineering", ed. by Luque et al., (C) 2003 John Wiley and Sons, p. 288.*

"Handbook of Thin-Film Deposition Processes and Techniques—Principles, Methods, Equipment and Application", 2nd edition, ed. by Kern et al., (C) 2002, William Andrew PublishingNoyes, chqapter 1, p. 13.*

Kaydanova et al., "Direct Inkjet Printing of Composite Thin Barium Strontium Titanate Films," J. Mater. Res., vol. 18, No 12, Dec. 2003.

Kaydanova et al., "Direct Write Contacts for Solar Cells," Photovoltaic Specialists Conference, 2005.

Curtis et al., "Multi-layer Inkjet Printed Contacts for Silicon Solar Cells," U.S. Department of Energy, 2006.

Mette et al., "Novel Metal Jet Printing Technique for the Front Side Metallization of Highly Efficient Industrial Silicon Solar Cells," Fraunhofer Institute for Solar Energy Systems, Sep. 4, 2006.

* cited by examiner

METALLIZATION CONTACT STRUCTURES AND METHODS FOR FORMING MULTIPLE-LAYER ELECTRODE STRUCTURES FOR SILICON SOLAR CELLS

BACKGROUND

Described herein are metallization contact structures and methods for forming multiple-layer electrode structures for silicon photovoltaic cells (hereinafter "silicon solar cells"). The metallization contact structures and methods for forming multiple-layer electrode structures provide silicon solar cells having low contact resistance with a small contact area and lowered surface recombination. The silicon solar cells provided by the metallization contact structures and methods maintain high conductivity, solderability and stability of current via a silver gridline electrode.

Solar cells are typically photovoltaic devices that convert sunlight directly into electricity. Solar cells typically include a silicon semiconductor that absorbs light irradiation, such as sunlight in a way that creates free electrons, which in turn are caused to flow in the presence of a built-in field to create direct current (hereinafter "DC") power. The DC power generated by several PV cells may be collected on a grid placed on the cell. Current from multiple PV cells is then combined by series and parallel combinations into higher currents and voltages. The DC power thus collected may then be sent over wires, often many dozens or even hundreds of wires.

The state of the art for metallizing silicon solar cells for terrestrial deployment is screen printing. Screen printing has been used for decades, is a robust, simple, rapid, and cost-effective metallization method and can be easily automated for large-scale solar cell manufacturing. In a conventional screen printing approach to metallization solar cells, a squeegee presses a paste through a mesh with an emulsion pattern that is held over the wafer. A typical paste for solar cell metallization consists of a mixture of silver particles and a glass flit in an organic vehicle. When the wafer is fired, the organic vehicle decomposes and the glass flit softens and then dissolves the surface passivation layer and creating a pathway for the silver to reach silicon by forming a multitude of random points under a silver pattern formed by the paste. The surface passivation, which may also serve as an anti-reflection coating, is a dielectric layer, such as a silicon nitride layer and is an essential part of the cell covering the cell except for electrical contact areas. Upper portions of the paste densify into one or more metal thick films that carries current from the cell. These films form gridlines on a front-side of the wafer, and a base contact on a backside of the wafer. The silver of the paste is also a surface to which tabs connecting adjacent cells may be soldered.

While the glass frit approach combined with screen printing to opening contacts has an advantage, such that no separate process step is needed to open the passivation, the glass frit approach has significant drawbacks which limit the further improvement of cell efficiency. First, contact resistance is very large, for example, specific contact resistance between the semiconductor emitter layer (sun-exposed surface) and the silver gridline is at the order of about $10^{-3}$ $\Omega\cdot cm^2$. This specific contact resistance between the semiconductor emitter layer and the silver gridline is several orders of magnitude higher than the specific contact resistance that may be reached in semiconductor integrated circuit devices, which is at the order of about $10^{-7}$ $\Omega\cdot cm^2$. Due to this large specific contact resistance, the emitter layer in a solar cell must be heavily doped and large contact area between the emitter and silver gridline must be used, otherwise the silver of the paste cannot make good electrical contact to the silicon. The heavy doping kills the minority carrier lifetime in the top portion of the cell and limits the blue response of the cell, and the large contact area generates higher surface recombination rate. As a result, the overall efficiency of the solar cell is reduced. Another problem with the glass flit approach is a narrow process window. The narrow process window may be a problem because a thermal cycle, that fires the gridline, must burn through the silicon nitride to provide electrical contact between the silicon and the silver without allowing the silver to shunt or otherwise damage the junction. This narrow process window severely limits the process time to the order of about 30 seconds and temperature band to about 10° C. around the peak firing temperature.

Ideally, a metallization technology for silicon solar cells should form the gridline electrodes with low specific contact resistance and thus low contact area, high conductivity, good solderability, and long time stability. Because it is very difficult for a single layer electrode to meet all these requirements, several methods for forming multiple-layer electrode strictures have been proposed for silicon solar cells.

U.S. Patent Publication No. 2007/0169806 A1 (filed on Jan. 20, 2006) discloses forming multiple-layer gridline front surface electrodes by forming contact holes through the passivation layer using a non-contact patterning apparatus such as a laser-based patterning system. The contact holes may be filled by inkjet printed nanophase metallic inks and covered with silver gridlines. However, several problems associate with using printed nanophase metallic inks for filling the contact holes include quality and availability of the nanophase metallic inks, the wetting behavior and contact characteristic between the nanophase metallic ink and the silicon surface in the contact holes, and the process compatibility of nanophase metallic ink with firing silver gridlines.

U.S. Patent Publication No. 2004/0200520 A1 (filed on Apr. 10, 2003) discloses a multiple-layer backside electrode structure that is formed by making contact holes through chemically etching the passivation or anti-reflection coating layer, followed by sputtering or evaporating a three layer-seed metal stack to form the contact with emitter and plating copper and a thin metal capping layer to form gridlines. However, chemically etching the passivation layer involves several extra process steps including applying an etch resist layer, patterning the etching resist layer, and striping off the etching resist layer after patterning the passivation layer.

U.S. Patent Publication No. 2005/0022862 A1 (filed on Aug. 1, 2003) discloses screen printing a liquid ink pattern layer devoid of particles onto the silicon oxide passivation layer to form a particle-devoid ink pattern layer as an etching protection mask. However, the particle-devoid ink pattern layer must be stripped off after etching the silicon oxide layer.

It is therefore deemed desirable to develop cost efficient, simple and non-complex metallization contact structures and methods for forming multiple-layer electrode structures for silicon solar cells that provide low contact resistance, low contact area, high conductivity, high solderability, and high stability from solar exposure. Such metallization contact structures and methods for forming multiple-layer electrode structures may overcome problems associated with current single layer electrode structures as well as the complexity and uncertainty associated with known prior art approaches for forming multiple-layer electrode structures.

SUMMARY

A metallization contact and multiple-layer electrode structure may have a semiconductor substrate including a dielectric layer and contact openings formed in the dielectric layer. The contact openings may form underlying gridlines for alignment and formation of a current carrying sintered metal gridlines to produce the silicon solar cell. A conductive contact layer may be deposited into the contact openings in dielectric layer of the semiconductor substrate. A metal bearing ink may be deposited onto a portion of the conductive contact layer and/or may be aligned with the contact openings formed in the dielectric layer of the semiconductor substrate. A thermal processing of the semiconductor substrate may form the current carrying sintered metal gridlines from the metal bearing ink.

The conductive contact layer may be patterned by removing exposed portion of the conductive contact layer from the semiconductor substrate. The deposited metal bearing ink may form a protective mask over unexposed portions of the conductive contact layer to prevent the unexposed portions from being removed with removal of the exposed portions of the conductive contact layer. The thermal processing of the semiconductor substrate may form the multiple-layer electrode structure and/or an optional metal silicide layer that is formed with the unexposed portions of the conductive contact layer, the metal bearing ink and the semiconductor substrate.

In embodiments, disclosed is a method for forming a multiple-layer electrode structure on a solar cell includes depositing a conductive contact layer on a semiconductor substrate. The method includes depositing a metal bearing ink onto a portion of the conductive contact layer, wherein exposed portions of the conductive contact layer are adjacent to the metal bearing ink and patterning the conductive contact layer by removing the exposed portions of the conductive layer from the semiconductor substrate.

Also disclosed is a method for forming a multiple-layer electrode structure on a solar cell includes providing a semiconductor substrate having a dielectric layer, wherein a plurality of openings are opened in the dielectric layer of the semiconductor substrate. Additionally, the method includes depositing a conductive contact layer on the semiconductor substrate, wherein the conductive contact layer is deposited into the plurality of openings. Further, the method includes depositing a metal bearing ink onto a portion of the conductive contact layer, wherein the metal bearing ink is aligned with the plurality of openings. Moreover, the method includes applying a chemical etchant to the semiconductor substrate to remove exposed portions of the conductive layer and to pattern the conductive contact layer.

In further embodiments, disclosed is a metallization contact structure on a semiconductor substrate includes a patterned dielectric layer including one or more openings to the semiconductor substrate. Moreover, the metallization contact structure includes a current carrying sintered metal gridline, wherein the current carrying sintered metal gridline is aligned with the one or more openings and a patterned conductive contact layer interposed between the current carrying sintered metal gridline and the patterned dielectric layer such that the conductive contact layer pattern is aligned with the current carrying sintered metal gridline.

In yet further embodiments, disclosed is a method for patterning a layer including depositing a layer on a substrate and depositing a metal bearing ink onto a portion of the layer, wherein exposed portions of the layer are adjacent to the metal bearing ink. Moreover, the method includes patterning the layer by removing the exposed portions of the layer from the substrate using the deposited metal bearing ink as a protective mask and removing the metal bearing ink.

In still further embodiments, disclosed is a method to form a functional structure including depositing a first layer of functional material on a substrate and depositing a second layer of functional material onto a portion of the first layer of functional material, wherein exposed portions of the first layer of functional material are adjacent to the second layer of functional material. Moreover, the method includes patterning the first layer of functional material by removing the exposed portions of the first layer of functional material from the substrate using the deposited second layer of functional material as a protection mask and the second layer of functional material is remained on the substrate and becomes a part of the functional structure.

EMBODIMENTS

The present disclosure relates generally to metallization contact structures and methods for forming multiple-layer electrode structures for silicon photovoltaic cells (silicon solar cells). The metallization contact structures and methods for forming multiple-layer electrode structures may have a patterned conductive contact layer deposited on a semiconductor substrate. Contact openings may be formed in the semiconductor substrate via a non-contact patterning apparatus and may be filled with the deposited conductive contact layer. A metal bearing ink may be deposited onto the conductive contact layer and aligned with the contact openings formed in the semiconductor substrate. Unexposed portions of the conductive contact layer may be protectively masked with the metal bearing ink deposited thereon. The conductive contact layer may be patterned by removing an exposed portion of the conductive contact layer from the semiconductor substrate. The unexposed portion of the conductive contact layer and the metal bearing ink may be thermally processed to form an emitter layer, an optional metal silicide layer, and low contact resistance metal layer. Moreover, the thermal processing of the metal bearing ink may form current carrying sintered metal gridlines on the semiconductor substrate.

Figure 1:
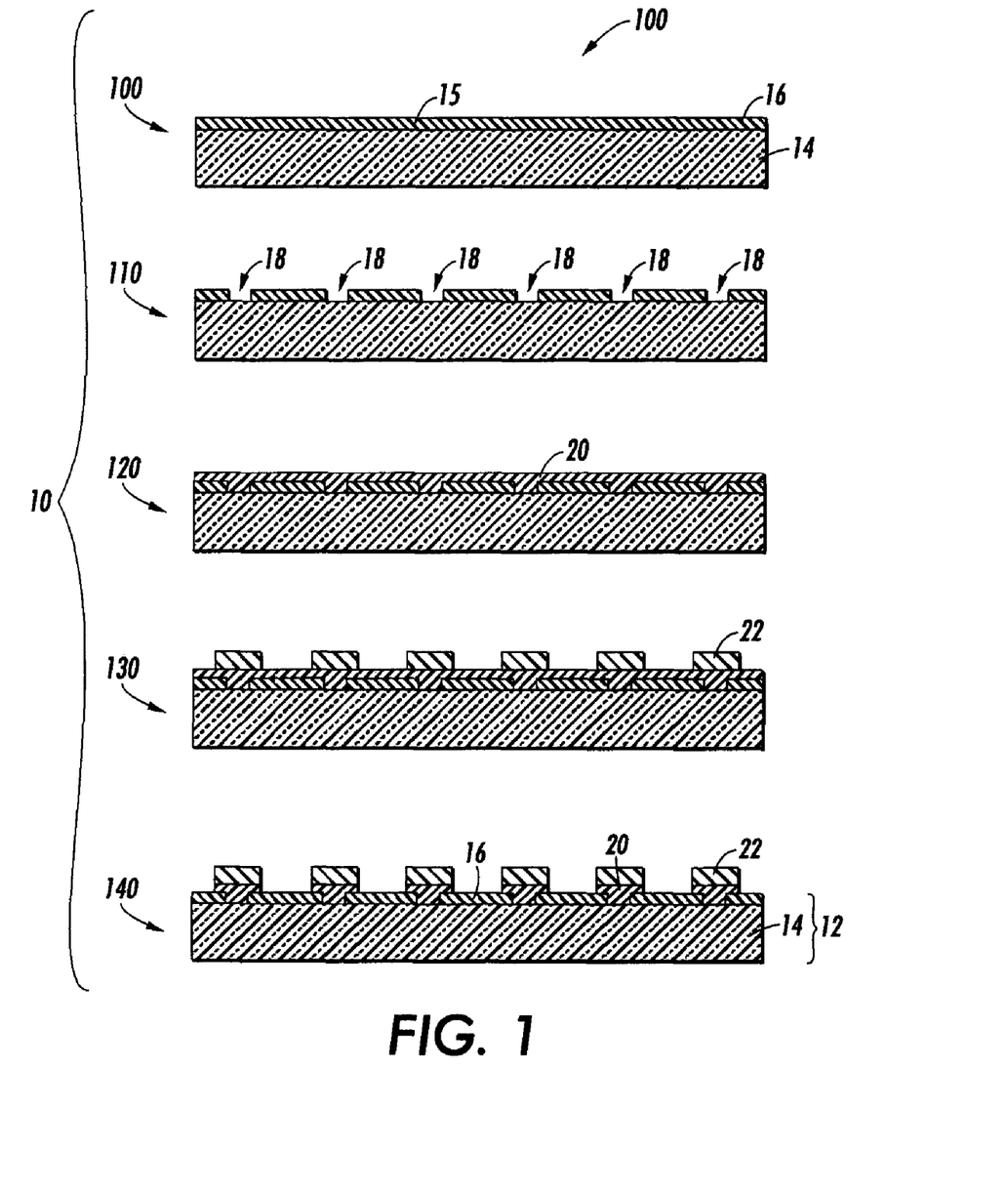
FIG. 1 illustrates a method for forming a multiple-layer electrode structure.

Referring now to the drawings as illustrative of an example structure and process herein, and wherein like numerals refer to like parts, the present disclosure relates to a method 10 for forming a multiple-layer electrode structure 12 for a silicon solar cell as illustrated in FIG. 1. A processing system 200 (hereinafter "system 200") to process each step of the method 10 is given in FIG. 2. It should be understood that the processing system 200 in FIG. 2 is an illustrative example for achieving the method 10 and is not does limit the method 10 to the specific embodiment of the system 200.

Figure 2:
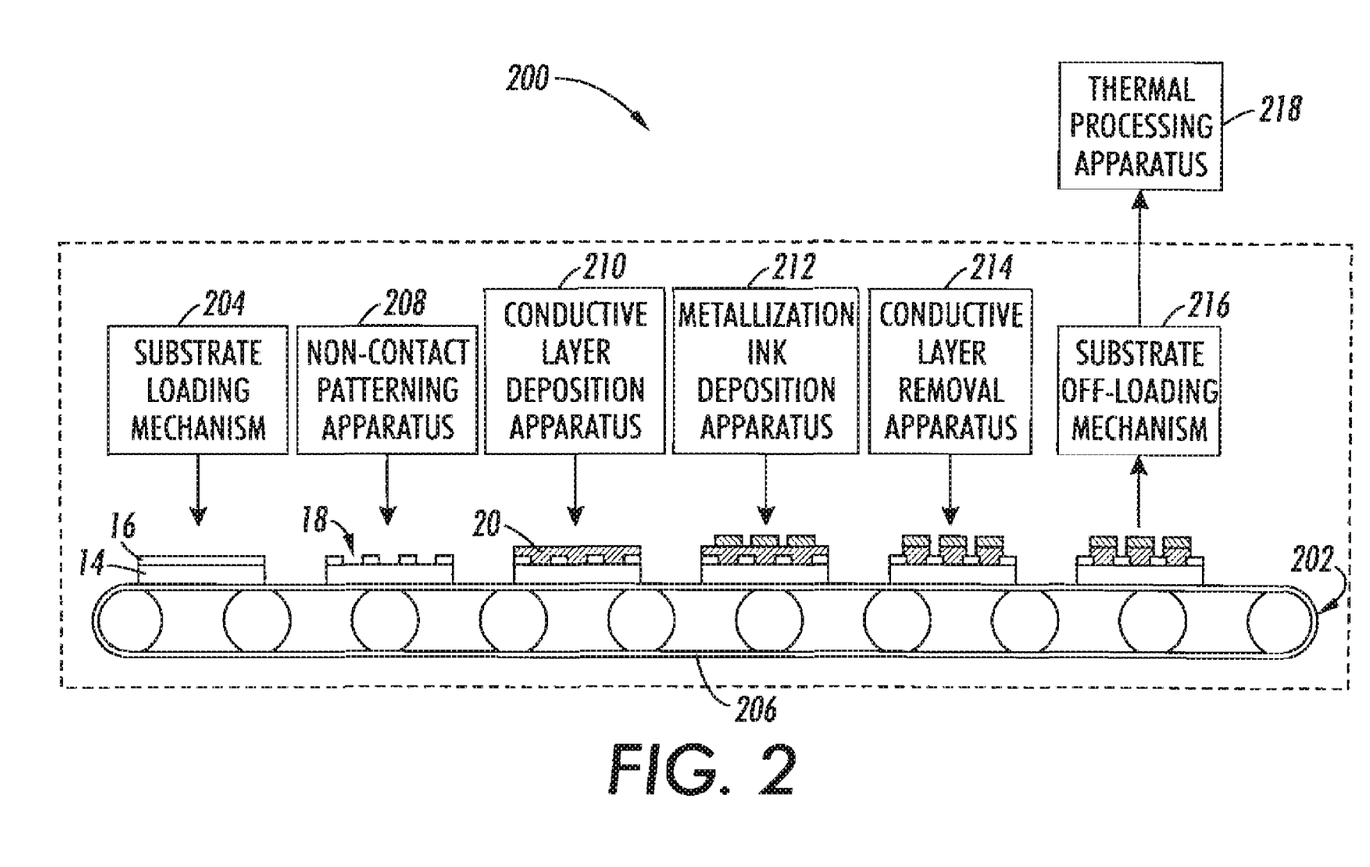
FIG. 2 illustrates a processing system for forming a multiple-layer electrode structure.

A semiconductor substrate 14 may be provided as shown at Step 100 of FIG. 1 and in FIG. 2. The semiconductor substrate 14 may have a dielectric layer 16 deposited on a top side 15 of the semiconductor substrate 14. The dielectric layer 16 may partially or substantially cover the top side 15 of the semiconductor substrate 14. The dielectric layer may have a thickness range of from about 5 nm to about 500 nm, from about 20 nm to 200 nm, or from about 50 nm to 150 nm. The semiconductor substrate 14 may include at least an n$^+$ emitter layer or region (not showing in the Figures) underneath the dielectric layer 16.

The semiconductor substrate 14 may be loaded onto a conveyor mechanism 202 of system 200 by a substrate loading mechanism 204 to form the silicon solar cell as shown in FIG. 2. The system 200 may include an optional conveyor mechanism 202 (hereinafter "the conveyor mechanism 202"), a substrate loading mechanism 204, a non-contact patterning device 208, a conductive contact layer deposition device 210, a metal bearing ink deposition device 212, a conductive contact layer removal apparatus 214, and/or an optional substrate off-loading mechanism 216 (hereinafter "the substrate off-loading mechanism 216"). The substrate loading mechanism 204 and substrate off-loading mechanism 216 may operate in a manner well known to those skilled in the art, and therefore are not described in additional detail herein.

The dielectric layer 16 may be pre-formed on the top side 15 of semiconductor substrate 14 before the semiconductor substrate 14 is transferred to the conveyor mechanism 202 via the substrate loading mechanism 204. Further, the semiconductor substrate 14 may have been treated to include one or more doped diffusion regions, such as an n$^+$ emitter layer or region. The conveyor mechanism 202 may have a conveyor 206 as shown in FIG. 2. The conveyor 206 of the conveyor mechanism 202 may have an upward-facing belt portion that may receive and may convey the semiconductor substrate 14 to the non-contact patterning device 208, the conductive layer deposition device 210, the metal bearing ink deposition device 212, the conductive layer removal apparatus 214, and/or the substrate off-loading mechanism 216. The one non-contact patterning device 208, the conductive layer deposition device 210, the metal bearing ink deposition device 212, the conductive layer removal apparatus 214 and the substrate off-loading mechanism 216 may be sequentially arranged in the conveying direction of conveyor 206, such as from the left side of FIG. 2 to the right side of FIG. 2.

In embodiments, the semiconductor substrate 14 may be made of a semiconductor material, such as silicon and the like. In embodiments, a suitable dielectric material for the dielectric layer 16 of the semiconductor substrate 14 may include an oxide such as $SiO_2$ or $TiO_2$, or a nitride such as silicon nitride, or silicon oxygen nitride.

The conveyor 206 of the conveyor mechanism 202 may convey the semiconductor substrate 14 from the substrate loading mechanism 204 to the non-contact patterning apparatus 208. One or more contact openings 18 (hereinafter "one or more openings 18") may be formed on the semiconductor substrate 14 and/or in the dielectric layer 16 of the semiconductor substrate 14 as shown in Step 110 of FIG. 1.

Figure 5:
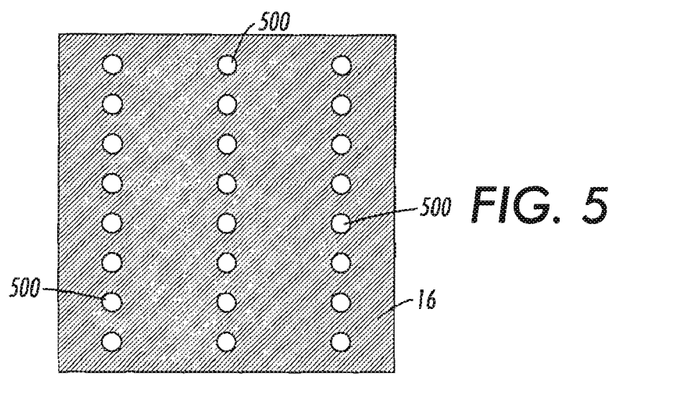
FIG. 5 illustrates a top plan view of a top surface of a dielectric layer having holes formed therein.
Figure 6:
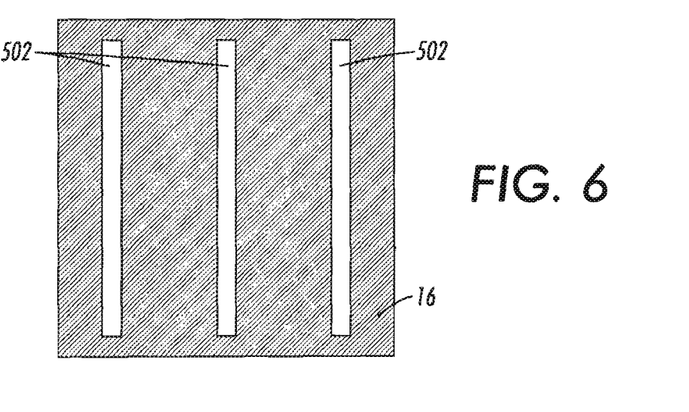
FIG. 6 illustrates a top plan view of a top surface of a dielectric layer having narrow lines formed therein.
Figure 7:
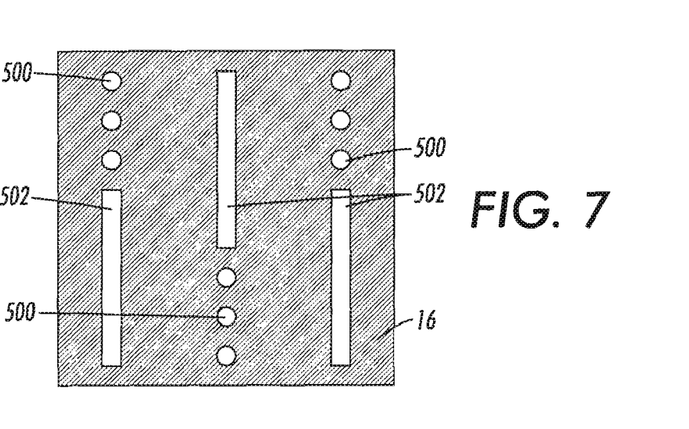
FIG. 7 illustrates a top plan view of a top surface of a dielectric layer having a mixture of holes and narrow lines formed therein.

In embodiments, the one or more contact openings 18 formed on the dielectric layer 16 may be at least one or a plurality of holes 500 as shown in FIG. 5, at least one or a plurality of lines 502 as shown in FIG. 6, a combination of at least one or a plurality of holes 500 and at least one or a plurality of lines 502 as shown in FIG. 7, or other shapes (not shown in the drawings). In embodiments, each of the at least one or a plurality of holes 500 may have a similar shape, width and/or diameter. The diameter of each of the at least one or a plurality of holes 500 may be in a range of about 1 μm to about 200 μm, from about 5 μm to about 100 μm or from about 10 μm to about 50 μm. Each of the at least one or a plurality of holes 500 may have a pitch of about 0.01 mm to about 2 mm, from about 0.1 mm to about 1 mm or from about 0.2 mm to about 0.5 mm.

In embodiments, the at least one or a plurality of lines 502 may be grooves or trenches in the dielectric layer 16. The width of each line of the plurality of lines 502 may be in a range from about 1 μm to about 200 μm, from about 5 μm to about 100 μm or from about 10 μm to about 50 μm. In embodiments, each of the one or more contact openings 18 may include a perimeter having other geometric shapes besides holes and/or narrow lines.

The one or more openings 18 may be an underlying gridline for a current carrying sintered metal gridline deposited onto the semiconductor substrate 14. The one or more openings 18 may be formed by the non-contact patterning apparatus 208 through the dielectric layer 16 to expose doped portions of the semiconductor substrate 14 and to open the top side 15 of the semiconductor substrate 14 as shown in Step 110 of FIG. 1 and in FIG. 2.

In embodiments, the non-contact patterning apparatus 208 may be a laser-based ablation device capable of generating laser pulses LP of sufficient energy to ablate (remove) portions of dielectric layer 16 to form the one or more openings 18 that expose the top side 15 of semiconductor substrate 14 without the need for cleaning or other processing prior to metallization. An advantage of using laser ablation is that semiconductor substrate 14 need not be rinsed and dried after the ablation is performed. Avoidance of rinsing and drying steps enables the rapid and successive processing of the one or more openings 18 following by the metallization. Alternatively, the non-contact patterning apparatus 208 may be a particle-beam generating apparatus that forms the one or more openings 18 in the dielectric layer 16, such as an ion milling apparatus.

Figure 3:
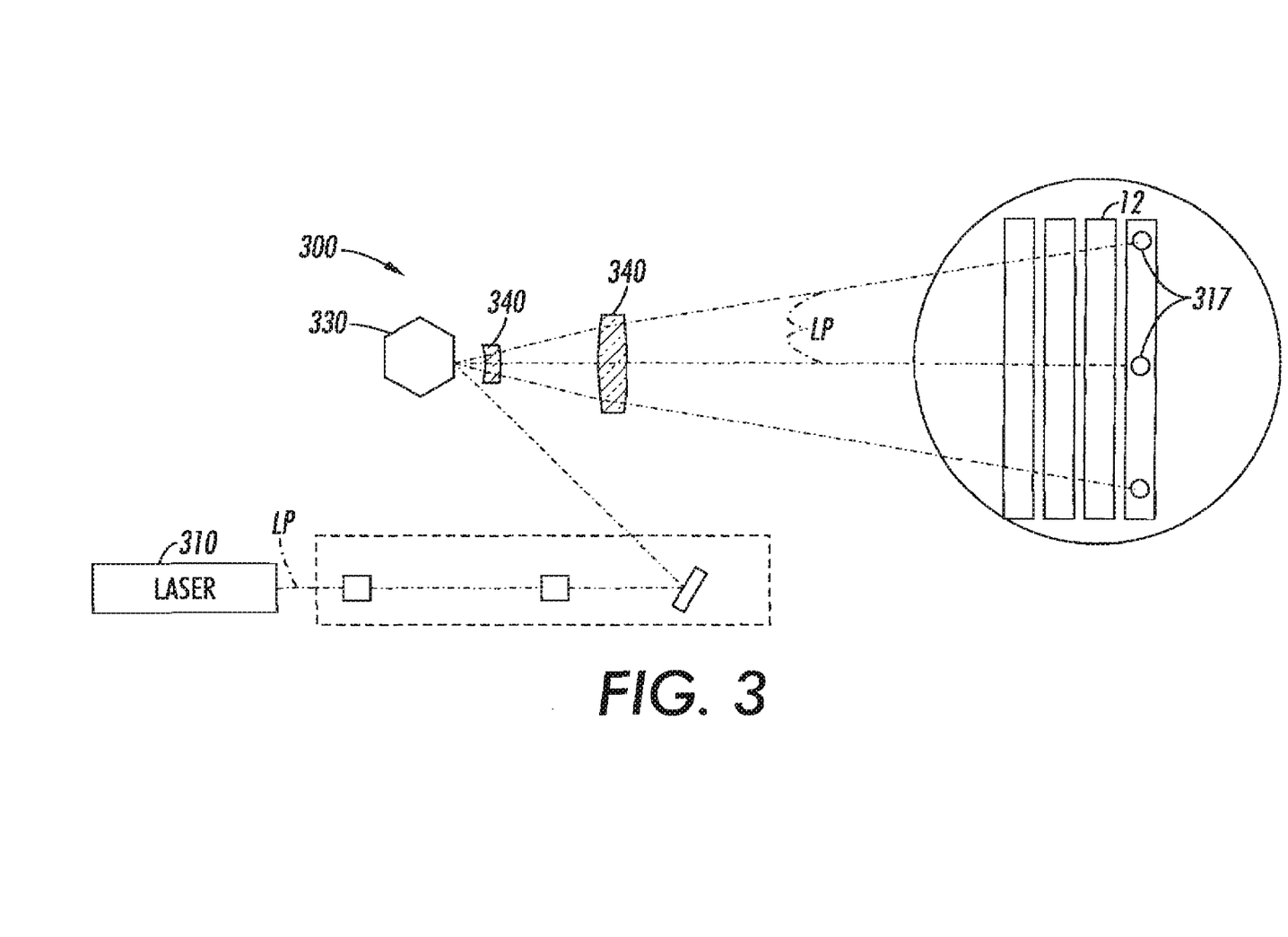
FIG. 3 illustrates a top plan view depicting a laser-based patterning apparatus for forming contact openings in the semiconductor substrate.

In embodiments, the non-contact patterning device 208 may include, as shown in FIG. 3, a scanning-type laser apparatus 300 (laser apparatus 300) in which laser pulses LP generated by a laser 310 are directed by way of beam conditioning optics onto a rotating mirror 330 and through a suitable scan lens 340 such that laser pulses LP are directed in a predetermined scan pattern across the dielectric layer 16. The laser apparatus 300 may be similar to those used for writing the electrostatic image on the photoreceptor of a xerographic print engine. The throughput of such a laser-processing tool can be on the order of one substrate per second, which is a comparable printing speed to a low to medium range laser printer. The spot size or the average diameter of the one or more openings 18 determines the size of each ablated contact opening 317. This size is typically in the range of about 5 microns to about 50 microns in diameter.

In embodiments, the laser 310 is a Coherent Inc. model AVIA 266-300 Q-switched Nd-YAG operating at a pulse repetition rate on the order of about 100 KHz. The fluence needed to ablate the surface of the dielectric layer is oil the order of about 1 Joule/cm$^2$. The pulse length of the laser 310 is on the order of tens of nanoseconds. The wavelength can be on the order of about 266 nm. The short pulse and wavelength of such lasers ensure that the energy is deposited near the surface and any melting in the semiconductor substrate 14 is short lived. This minimizes any change to the doping profile of diffusion regions of the semiconductor substrate 14. The energy of a 266 nm photon is about 4.66 electron volts. Although the bandgap of the dielectric layer 16 varies over a wide range, this photon energy is comparable to the band gap of silicon nitride in its most transparent forms. These highly energetic photons are absorbed in the surface passivation and/or in the topmost nanometers of the underlying semiconductor substrate. A lightly doped emitter will have a phosphorous diffusion depth of about 200 nm, a sheet resistance on the order of about 100 ohms, and a non-degenerate level of dopant at the physical surface. The material of the semiconductor substrate 14 may be a good thermal conductor causing rapid quenching of the semiconductor substrate 14 melt formed below the surface of the passivation of the dielectric layer 16. In embodiments, suitable control of the process conditions allows removal of the silicon nitride passivation without significantly altering the thickness or doping profile of the underlying silicon layer.

In embodiments, the laser apparatus 300 includes a femtosecond laser. An advantage of using a femtosecond laser is that the laser energy can be deposited in a timeframe that is faster than the time required for the material to reach thermal equilibrium. Thus, passivation material can be ablated with less debris.

In embodiments, other contact or non-contact patterning apparatus or methods can also be employed to form the one or more openings 18, and as described earlier, these patterning processes may not be conducted by using the processing system 200 or on the conveyor 206. For example, the one or more openings 18 can be formed by chemical etching through direct printing of an etchant material onto the dielectric layer 16 of the semiconductor substrate 14, using ink jet printing, screen printing, pad printing or other printing method. Alternatively, the chemical etching may also be performed by direct printing an etching protective mask onto the dielectric layer 16 of the semiconductor substrate 14 and then putting the substrate into an etching solution. The etching protection mask can also be formed by spin coating, spray coating or evaporating a protection layer followed by patterning the protection layer.

The conveyor 206 of the conveyor mechanism 202 may convey the semiconductor substrate 14 with the one or more openings 18 from the non-contacting patterning apparatus 208 to the conductive contact layer deposition apparatus 210 as shown in FIG. 2. A conductive contact layer 20 may be deposited onto the semiconductor substrate 14 and the dielectric layer 16 on the top side 15 of the semiconductor substrate 14 via the conductive contact layer deposition apparatus 210 as shown at Step 120 in FIG. 1. The conductive contact layer 20 may have a thickness range from about 1 nm to about 2,000 nm, from about 5 nm to about 1000 nm or from about 20 nm to about 200 nm.

The conductive contact layer deposition apparatus 210 may deposit the conductive contact layer 20 onto the dielectric layer 16 and the semiconductor substrate 14. The conductive contact layer 20 may be deposited into and/or may fill the one or more openings 18 in the dielectric layer 16 as shown in FIG. 1. The conductive contact layer 20 may cover or substantially cover the top side 15 of the semiconductor substrate 14 through the one or more openings 18. In embodiments, the conductive contact layer 20 may be deposited substantially uniformly and/or consistently across the top side 15 of the semiconductor substrate 14 and the dielectric layer 16.

The conductive contact layer 20 may be, for example, a thin metal layer that has a low contact resistance and/or a robust adhesion to the semiconductor substrate 14 and/or an $n^+$ emitter layer in the semiconductor substrate 14. In embodiments, the conductive layer 20 may be made from a conductive metal material, such as nickel (Ni), cobalt (Co), titanium (Ti), tantalum (Ta), tungsten (W), molybdenum (Mo), and the like. The conductive contact layer deposition apparatus 210 may deposit the conductive contact layer 20 onto the semiconductor substrate 14 by a deposition method, such as sputtering, evaporation, chemical vapor deposition, spray coating, spin coating and/or ink jet printing. With spraying, spinning and jet printing by the conductive contact layer deposition apparatus 210, suitable material for the conductive contact layer 20 may include a metal organic ink or a nanoparticle ink. The deposition of the conductive contact layer 20 can also be processed without using the system 200 or the conveyor 206 as shown in FIG. 2.

The term "nanoparticle" refers to, for example, average particle sizes of from about 1 nm to about 500 nm. For example, particles of the nanoparticle ink may have an average particle size of from about 1 nm to about 250 nm, from about 5 nm to about 150 nm or from about 10 nm to about 100 nm.

The conveyor 206 of the conveyor mechanism 202 may convey the semiconductor substrate with the conductive contact layer 20 from the conductive contact layer deposition apparatus 210 to the metal bearing ink deposition apparatus 212 as shown in FIG. 2. A metal bearing ink 22 may be deposited onto the conductive contact layer 20 via the metal bearing ink deposition apparatus 212 as shown at Step 130 of FIG. 1. The metal bearing ink deposition apparatus 212 may deposit the metal bearing ink 22 onto the conductive contact layer 20 that is located above the one or more openings 18 in the dielectric layer 16 so that the metal bearing ink 22 may be aligned and/or registered with the one or more openings 18 formed in the dielectric layer 16. As a result, the metal bearing ink 22 may be deposited onto the conductive contact layer 20 and may form a metal bearing ink gridline on top the conductive contact layer 20 and the one or more openings 18 formed in the dielectric layer 16. Moreover, the metal bearing ink 22 on the semiconductor substrate 14 may be thermally processed to form a sintered metal gridline that is aligned or registered with the one or more openings 18 in the dielectric layer 16.

The metal bearing ink 22 may be deposited onto unexposed portions of the conductive contact layer 20 that may be located above the one or more openings 18 in the dielectric layer 16 as shown at Step 130 in FIG. 1. As a result, the unexposed portions of the conductive contact layer 20 may be masked by or protected by the metal bearing ink 22. The unexposed portions of the conductive contact layer 20 may be located between the metal bearing ink 22 and the semiconductor substrate 14. The metal bearing ink 22 may not be deposited onto exposed portions of the conductive contact layer 20. As a result, the exposed portions of the conductive contact layer 20 may be uncovered and/or unmasked by metal bearing ink 22.

The exposed portions of the conductive contact layer 20 may be adjacent to one or more unexposed portions and/or to the metal bearing ink 22. Further, the exposed portions of the conductive contact layer 20 may be located between more than one of the unexposed portions of the conductive contact layer 20. Moreover, the unexposed portions of the conductive contact layer 20 and the metal bearing ink 22 may form a gridline for the multiple-layer electrode structure 12 of the silicon solar cell.

Deposition of the metal bearing ink 22 onto the unexposed portions of the conductive contact layer 20 may thereby form highly conductive current-carrying metal lines that are coupled to the underlying semiconductor substrate 14 by way of the low resistance contact portions formed with the one or more openings 18 in the dielectric layer 16 and the unexposed portions of the conductive contact layer 20. The unexposed portions of the conductive contact layer 20 under the metal bearing ink 22 may form a barrier layer to prevent the diffusion of metal bearing ink 22 into the semiconductor substrate 14.

The metal bearing ink deposition apparatus 212 may include a screen printing-type apparatus, an extrusion-type dispensing apparatus, a pad printing apparatus, an inkjet printing apparatus and the like for depositing the metal bearing ink 22 onto the conductive contact layer 20. Depositing the metal bearing ink 22 with the metal bearing ink deposition apparatus 212 may enable the precise placement of the metallization 22 onto the conductive layer 20 and over the one or more openings 18 in the dielectric layer 16. The deposited metal bearing ink may have a thickness range from about 0.1 µm to about 1000 µm, from about 5 µm to about 500 µm or from about 10 µm to about 100 µm.

The screen printing-type apparatus may be utilized to deposit metal bearing ink 22 onto the unexposed portions of the conductive contact layer 20. The screen printing-type apparatus may provide a highly accurate and efficient mechanism for depositing the metal bearing ink 22 onto the semiconductor substrate 14. The screen printing-type apparatus may also provide an advantage over conventional methods by allowing the accurate deposition of the metal bearing ink 22 onto the conductive layer 20 so that the metal bearing ink 22 is aligned or registered with the one or more openings 18 in the dielectric layer 20.

In embodiments, the metal bearing ink deposition apparatus 212 may include an extrusion-type dispensing apparatus to deposit the metal bearing ink 22 onto the conductive contact layer 20. As a result, the metal bearing ink 22 may form gridlines for a front surface contact cell-type device including a high aspect extruded metal line supported on each side by a co-extruded transparent material.

The metal bearing ink 22 may comprise polymer binder resin or organic vehicle, metal particles (or powder) or flakes and an optional glass frit in a solvent. The materials for the metal particles or flakes may be, for example, silver, tin, nickel, copper, or other metal materials. In embodiments, the metal bearing ink may be dried and the polymer binder resin may render the dried metal bearing ink chemically resistant to chemical etchants that may be used for removing the exposed portions of the conductive contact layer 20 from the semiconductor substrate 14. Suitable polymer materials for the functional material include cellulose polymers such as ethyl cellulose, polymethylmethacrylate (hereinafter "PMMA"), wood rosin, phenolic resins, polymethacrylates and the like. The metal bearing ink 22 may have the weight percent range of metal particles or flakes from about 5% to about 98%, from about 20% to about 90% or from about 50% to about 80%.

The metal bearing ink deposition apparatus 212 may include an inkjet-type dispensing apparatus to directly printing the metal bearing ink 22 onto the conductive contact layer 20. When being directly printed onto the conductive contact layer 20 via the inkjet-type dispensing apparatus, the metal bearing ink 22 may be a nanophase metallic ink having nanoparticles of the metal suspended in the ink. Alternatively, the metal bearing ink 22 may be a metal organic ink having a solution of one or more organometallic compounds.

The metal bearing ink 22 may be deposited in a pattern on the conductive contact layer 20. The patterned metal bearing ink 22 may be used as a seed for plating additional metal particles to form a bulk of the metal gridlines for the silicon solar cell. For example, a thin layer of metal bearing ink 22 having the one or more organometallic compounds may be inkjet printed onto the conductive layer 20 and additional metal particles may be required to be built tip on the thin layer of metal bearing ink 22 to form current carrying metal gridlines. In this way, the deposited metal bearing ink could be as thin as to about 1 nm.

The conveyor 206 of the conveyor mechanism 202 may convey the semiconductor substrate 14 having the conductive contact layer 20 and metal bearing ink 22 from the metal bearing ink deposition apparatus 212 to a conductive contact layer removal apparatus 214 as shown in FIG. 2. The conductive contact layer removal apparatus 214 may pattern the conductive contact layer 20 that is interposed between the semiconductor substrate 14 and the metal bearing ink 22. The conductive contact layer may be patterned by removing the exposed portions of the conductive contact layer 20 from the semiconductor substrate 14 as shown at Step 140 in FIG. 1.

As one method of patterning, the semiconductor substrate 14 may be exposed to a chemical etchant via the conductive contact layer removal apparatus 214. The semiconductor substrate 14 may be exposed to the chemical etchant to remove the exposed portions of the conductive contact layer 20 to pattern the conductive contact layer 20. The chemical etchant may chemically react with and/or dissolve and remove the exposed portions of the conductive contact layer 20 from the semiconductor substrate 14 to pattern the conductive contact layer 20.

The semiconductor substrate 14 may be exposed to the chemical etchant for a duration of time, such as about 0.5 seconds to about 30 minutes. The chemical etchant desirably does not damage the metal bearing ink 22 and/or the unexposed portions of the conductive contact layer 20 that is masked or protected by the metal bearing ink 22.

In embodiments, a suitable chemical etchant for removing the exposed portions of the conductive contact layer 20 may include a ferric chloride etching solution, hydrofluoric acid, nitric acid, phosphoric acid, and the like. Again, it is not necessary to use the system 200 or the conveyor 206 to pattern the conductive contact layer 20 on the semiconductor substrate 14.

The conveyor 206 of the conveyor mechanism 202 may convey the semiconductor substrate 14 having the unexposed portions of the conductive contact layer 20 and the metal bearing ink 22 from the conductive layer removal apparatus 214 to substrate off-loading mechanism 216. The substrate off-loading mechanism 216 may remove the semiconductor substrate 14 from the conveyor 206 after processing by the metal bearing ink deposition apparatus 212 and the conductive layer removal apparatus 214 is completed in accordance with the description provided below.

The semiconductor substrate 14 may be transferred from the substrate off-loading mechanism 216 to a thermal processing system 218 for subsequent thermal processing of the semiconductor substrate 14. The semiconductor substrate 14 may be thermally processed by firing at a temperature from about 200° C. to about 1,000° C., from about 400° C. to about 900° C. or from about 500° C. to about 850° C., thereby deriving a sintered structure of the metal particles from the metal bearing ink. The solvent in the metal bearing ink 22 may evaporate or be decomposed during the thermal processing.

The sintered structure of metal particles herein is distinct from a structure achieved by electroplating. In electroplating, a metal is built up from the molecular lever. In the sintered structure, however, the metal particles in the metal bearing ink 22 may not melt and form a liquid during the thermal processing of the semiconductor substrate 14. A solid state interaction occurs between the metal particles in the metal bearing ink 22 during the thermal processing. The metal particles in the metal bearing ink 22 sinter and bond to each other to form a dense metal structure, such as a current carrying metal structure. As a result, the metal bearing ink 22 may form a current carrying sintered metal gridlines on the conductive contact layer 20 after the thermal processing of the semiconductor substrate 14 in the thermal processing system 218.

The semiconductor substrate 14 may be thermally processed by the thermal processing system 218 to form the multiple-layer electrode structure 12 with the current carrying sintered metal gridlines, the conductive contact layer 20 and the semiconductor substrate 14. As a result, a thin conductor/semiconductor layer and/or an emitter layer may be formed. When metals such as nickel, cobalt, titanium, tantalum, tungsten or molybdenum are used as the conductive contact layer 20, during or after the thermal processing an optional metal silicide layer, such is a nickel silicide layer may be formed at the interface between the conductive contact layer 20 and the semiconductor substrate 14.

The multiple-layer electrode structure 12 formed by the thermal processing of the semiconductor substrate 14 including the current carrying sintered metal gridlines may reduce contact resistance and contact area between the semiconductor substrate 14 and the current carrying sintered metal gridlines. As a result, metal bearing ink/conductive layer multiple-layer electrode structure 12 of the semiconductor substrate 14 may increase the absolute efficiency of a silicon solar cell including the multiple-layer electrode structure 12 by about 0.5% to about 3%, which may result in a relative improvement for the silicon solar cell by about 4% to about 20%.

The multiple-layer electrode structure 12 and the semiconductor substrate 14 may have a contact area that may be reduced by a factor of about 50 to about 400 when compared to the contact area of traditional silicon solar cells. The decreased contact area may decrease recombination between the semiconductor substrate 14 and the conductive contact layer 20 and/or the metal bearing ink 22. The multiple-layer electrode structure 12 may include use of a lightly doped emitter layer and as a result, the blue response and light absorption can be improved. All these improvements lead to increased efficiency. Further, a specific contact resistance between the multiple-layer electrode structure 12 and the semiconductor substrate 14 may be from smaller than about $10^{-1}$ ohm·cm$^2$ to about $10^{-8}$ ohm·cm$^2$, from smaller than about $10^{-2}$ ohm·cm$^2$ to about $10^{-8}$ ohm·cm$^2$ or from smaller than $10^{-4}$ ohm·cm$^2$ to about $10^{-8}$ ohm·cm$^2$.

In embodiments, the method 10 can also be used to make a multiple-layer electrode structure for back surface contact solar cells. That is, the method 10 may be applied to a backside of the semiconductor substrate 14 to make backside electrodes for the semiconductor substrate 14 if one or more p regions and/or one or more in regions are made on the backside of the semiconductor substrate 14. Additionally, the deposited metal bearing ink 22 may be removed using a solution, such as acetone after etching. As a result, the deposited metal bearing ink 22 may be generally considered a protection mask for the unexposed portions of the conductive layer 20, or even a nonconductive during the removal of the exposed portions of the conductive layer 20 by the conductive layer removal apparatus 214.

As described above, the conductive contact layer may be patterned before the thermal processing. Alternatively, the patterning of the conductive contact layer can also be performed after the thermal processing.

The multiple-layer electrode structures and the methods for forming the multiple-layer electrode structures disclosed herein may be used to form other multiple-layer electrode structures besides solar cells. They can also be used for any electric or electronic devices where low contact resistance and high current carrying electrodes are required.

The method disclosed herein may also be used to form any functional structures or devices that include a second layer functional material that may be deposited on a portion of the underlying first functional layer material and/or may be used as a protection mask to pattern the first functional material and become a part of the final functional structure.

The following Examples are submitted to illustrate embodiments of the present disclosure.

EXAMPLE 1

A silicon semiconductor substrate has a top side with a nitride dielectric layer formed thereon. A plurality of holes are formed in the nitride dielectric layer. Each of the plurality of holes has a diameter of about 20 μm and a pitch of about 0.25 mm. A Ni conductive contact layer is deposited onto the nitride dielectric layer and into the plurality of holes formed in the nitride dielectric layer. The Ni conductive contact layer has a thickness of about 100 nm.

An Ag metal bearing ink is deposited onto the Ni conductive contact layer via screen printing and is aligned or registered with the plurality of holes formed in the nitride dielectric layer. Unexposed portions of the Ni conductive contact layer are interposed between the silicon semiconductor substrate and the Ag metal bearing ink. Exposed portions of the Ni conductive contact layer are located between the plurality of holes and/or the Ag metal bearing ink. The Ni conductive contact layer is patterned by removing the exposed portion of the Ni conductive contact layer from the silicon semiconductor substrate.

The silicon semiconductor substrate is submersed in a $FeCl_3$ solution and the exposed portions of the Ni conductive contact layer are etched from the silicon semiconductor substrate. The unexposed portions of the Ni conductive contact layer and the Ag metal bearing ink on the silicon substrate form an Ag gridline on the silicon substrate. The silicon substrate is thermally processed by firing at about 500° C. to form a Ag/Ni multiple-layer electrode structure having current carrying sintered Ag gridlines.

The Ag/Ni multiple-layer electrode has a contact resistance of about less than 0.03 ohm for a line having a length of about 25.4 mm. Further, the Ag/Ni multiple-layer electrode has a contact resistance of about less than 0.0063 ohm for a standard line having a length of about 121 mm. This is comparable to the contact resistance of a standard screen printed Ag gridline which is about 0.0055 ohm, but the contact area of the Ag/Ni multiple-layer electrode structure of Example 1 is more than about 100 times smaller than the standard screen printed Ag gridline.

EXAMPLE 2

The Ag/Ni multiple-layer electrode of Example 2 was prepared in accordance to the preparation of the Ag/Ni multiple-layer electrode of Example 1, except that there is no holes or openings in the nitride dielectric layer. The Ag/Ni multiple-layer electrode of Example 2 did not exhibit ohmic contact between the Ag/Ni multiple-layer electrode and the silicon semiconductor substrate, and the contact resistance is more than about 15Ω for a line having a length of about 25.4 mm. In comparison, the results between Examples 1 and 2 showing that the Ni conductive contact layers form an effective barrier layer for preventing the Ag metal bearing ink from diffusing into the silicon semiconductor substrate and/or the nitride dielectric layer.

EXAMPLE 3

A Ni conductive contact layer was deposited via sputtering onto a silicon semiconductor substrate that was a conventional, lightly doped silicon wafer with a resistivity of about 0.5 Ω·cm. An Ag metal bearing ink was deposited onto unexposed portions of the Ni conductive contact layer and aligned with holes formed in a dielectric layer of the silicon semiconductor substrate. The Ni conductive contact layer was patterned by removing exposed portions of the Ni conductive contact layer by etching away the exposed portions of the Ni conductive contact layer from the silicon semiconductor substrate with a $FeCl_3$ solution. The silicon semiconductor substrate, with the Ni conductive contact layer and the Ag metal bearing ink, was thermally processed by firing at about 500° C. in air to form a Ag/Ni multiple-layer electrode and the current carrying sintered Ag gridlines.

Figure 4:
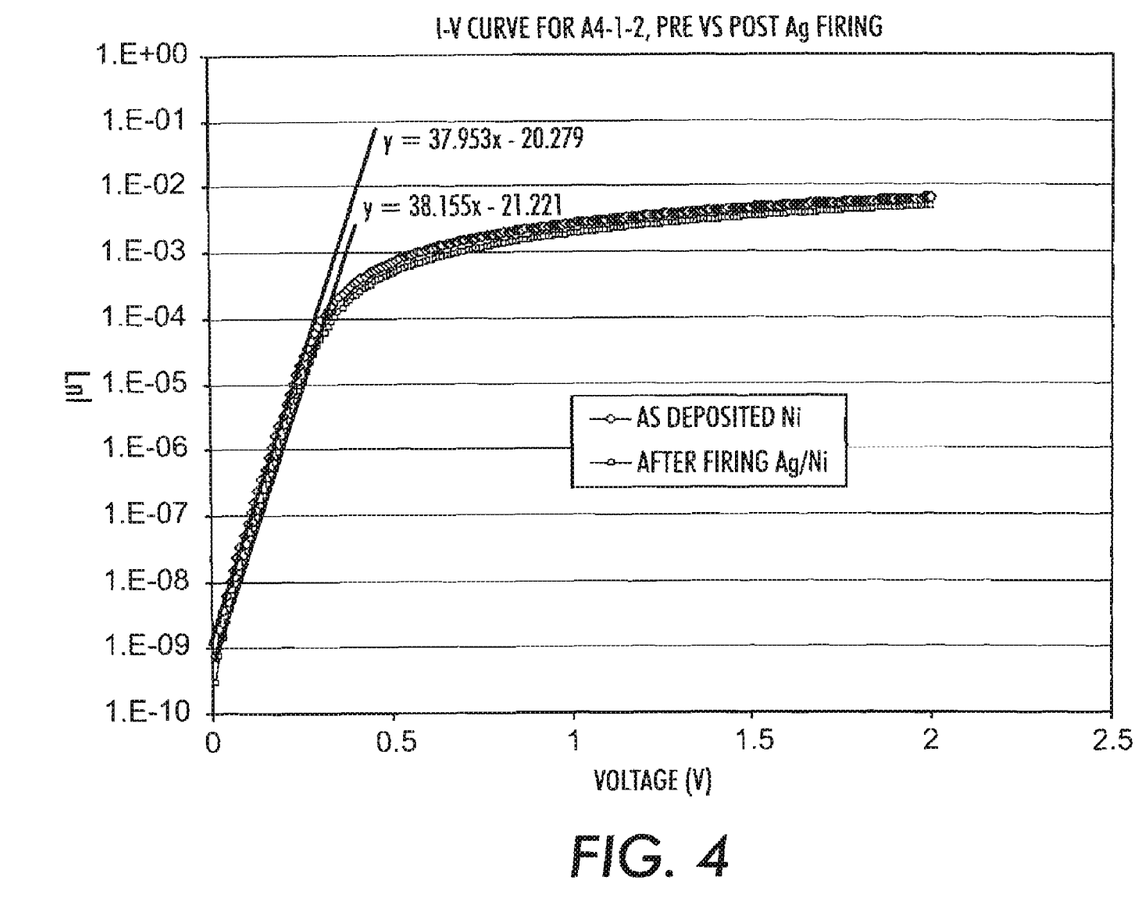
FIG. 4 illustrates a graph of I-V curves for a Ni conductive layer as deposited on silicon and after firing Ag/Ni at 500° C. in air.

The Ag/Ni multiple-layer electrode formed a Schottky barrier and did not form an ohmic contact. By forming a Schottky barrier, a Schottky barrier height may be calculated from an I-V curve for the Ag/Ni multiple-layer electrode to determine interface characteristics for the silicon semiconductor substrate and the Ag/Ni multiple-layer electrode. FIG. 4 illustrates a graph for the I-V curve associated the Ni conductive contact layer on the silicon semiconductor substrate that was covered by the Ag metal bearing ink as-deposited (via sputtering) and fired at about 500° C.

As shown in FIG. 4, the I-V curves do not exhibit a substantial difference between the as-deposited Ni condition (before applying Ag metal bearing ink) and after the thermal processing by firing the Ag/Ni multiple-layer electrode at about 500° C. (subsequent to formation of the current carrying sintered metal gridlines). Further, the example barrier heights of the as-deposited Ni conductive contact layer and after firing the Ag/Ni multiple-layer electrode and forming the current carrying sintered metal gridlines are about 0.58 eV and about 0.60 eV, respectively. A conventional barrier height between a Ni conductive contact layer and a silicon semiconductor substrate is about 0.61 eV and between a nickel silicide layer and silicon is about 0.67 eV.

A comparison of the example barrier heights and the conventional barrier heights confirm that firing the Ag/Ni multiple-layer electrode in air does not destroy the interface between the Ni or Ni silicide and silicon by degradation, such as oxidizing the Ni conductive layer which may occur when annealing a Ni conductive layer. Further, after firing the Ag/Ni multiple-layer electrode in air, the example barrier height may slightly increase and indicate formation of nickel silicide between the Ag/Ni multiple-layer electrode and the silicon semiconductor substrate. Still further, the Ag metal bearing ink may provide protection to the Ni conductive layer, because the Ag metal bearing ink may protect the underlying Ni conductive contact layer and the decomposition of organics in the Ag metal bearing ink may generate a localized reducing or inert atmosphere. Hence, the Ni conductive contact layer and the Ag metal bearing ink may be fired in air without changing the Ni conductive contact layer or nickel silicide/silicon interface. As a result, the Ni conductive layer may be used as a contact material for a silicon solar cells while maintaining a decreased contact resistance for the Ag/Ni multiple-layer electrode.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for forming a multiple-layer electrode structure on a solar cell, the method comprising:
   depositing a conductive contact layer directly on a semiconductor substrate;
   depositing a metal bearing ink directly onto a portion of the conductive contact layer, leaving exposed portions of the conductive contact layer adjacent to the metal bearing ink; and
   patterning the conductive contact layer by removing the exposed portions of the conductive contact layer from the semiconductor substrate using the deposited metal bearing ink as a protective mask such that side edges of the conductive contact layer are aligned along a plane with corresponding side edges of the metal bearing ink,
   wherein the patterning comprises a wet etching process including applying a wet chemical etchant to the semiconductor substrate, wherein the wet chemical etchant removes the exposed portions of the conductive contact layer from the semiconductor substrate.

2. The method according to claim 1, wherein the semiconductor substrate includes a dielectric layer.

3. The method according to claim 2, wherein the semiconductor substrate is comprised of silicon and the dielectric layer is comprised of nitride.

4. The method according to claim 2, wherein the dielectric layer is comprised of an oxide.

5. The method according to claim 2, wherein a plurality of openings are opened in the dielectric layer, and wherein the conductive contact layer is deposited into the plurality of openings.

6. The method according to claim 5, wherein the plurality of openings are opened in the dielectric layer by laser ablation, masking or chemical etching.

7. The method according to claim 5, wherein the plurality of openings are in a form selected from the group consisting of holes, narrow lines and mixtures thereof.

8. The method according to claim 1, wherein the method further comprises:
   thermally processing the electrode structure after removal of the exposed portion of the conductive contact layer.

9. The method according to claim 8, wherein the thermal processing is conducted at a temperature of from about 200° C. to about 1000° C.

10. The method according to claim 1, wherein the method further comprises performing the patterning after thermally processing the electrode structure.

11. The method according to claim 1, wherein the depositing the metal bearing ink comprises screen printing, extrusion, pad printing, jet printing or dispensing the metal bearing ink onto the conductive contact layer.

12. The method according to claim 1, wherein the depositing the conductive contact layer on the semiconductor substrate comprises sputtering, chemical vapor deposition, evaporation, spray coating, spin coating or jet printing.

13. The method according to claim 1, wherein the conductive contact layer is made of a metal.

14. The method according to claim 13, wherein the metal is selected from the group consisting of Ni, Co, Ti, Mo, Ta, and W.

15. The method according to claim 1, wherein the method further comprises:
   forming a metal silicide layer at an interface of the conductive contact layer and the semiconductor substrate, wherein the metal silicide layer is formed during or after thermal processing of the semiconductor substrate.

16. The method according to claim 1, wherein the metal bearing ink comprises polymer binder.

17. The method according to claim 16, wherein the polymer binder is selected from the group consisting of cellulose polymers, acrylates and mixtures thereof.

18. A method for forming a multiple-layer electrode structure on a solar cell, the method comprising:
   providing a semiconductor substrate having a dielectric layer, wherein a plurality of openings are opened in the dielectric layer of the semiconductor substrate;
   depositing a conductive contact layer directly on the semiconductor substrate, wherein the conductive contact layer is deposited into the plurality of openings;
   depositing a metal bearing ink directly onto a portion of the conductive contact layer, wherein the metal bearing ink is aligned with the plurality of openings;
   applying a wet chemical etchant to the semiconductor substrate to remove exposed portions of the conductive contact layer by a wet etching process and to pattern the conductive contact layer using the deposited metal bearing ink as a protective mask;
   wherein side edges of the metal bearing ink are aligned along a plane with corresponding side edges of the conductive contact layer; and
   thermally processing the electrode structure after removal of the exposed portion of the conductive contact layer.

19. The method according to claim 18, wherein the plurality of openings are opened in the dielectric layer by laser ablation, masking or chemical etching.

20. The method according to claim 18, wherein the depositing the metal bearing ink onto a portion of the conductive contact layer comprises screen printing, extrusion, pad printing, jet printing or dispensing the metal bearing ink onto the conductive contact layer.

21. The method according to claim 18, wherein the depositing the conductive contact layer on the semiconductor substrate comprises sputtering, chemical vapor deposition, evaporation, spray coating, spin coating or jet printing.

22. A metallization contact structure on a semiconductor substrate comprising:
   a patterned dielectric layer directly contacting the semiconductor substrate and having one or more openings to the semiconductor substrate;
   a current carrying sintered metal gridline, wherein the current carrying sintered metal gridline is aligned with the one or more openings; and
   a patterned conductive contact layer interposed between the current carrying sintered metal gridline and the patterned dielectric layer such that side edges of the conductive contact layer pattern are aligned along a plane with corresponding side edges of the current carrying sintered metal gridline, wherein one side of the conductive contact layer directly contacts the semiconductor substrate and an other side of the conductive contact layer directly contacts the sintered metal gridlines.

23. The metallization contact structure according to claim 22, wherein the semiconductor substrate, the current carrying sintered metal gridline and the patterned conductive layer form a solar cell with low contact resistance.

24. The metallization contact structure according to claim 22, wherein a thickness of the patterned conductive contact layer is from about 5 nm to about 1000 nm.

25. The metallization contact structure according to claim 22, wherein the specific contact resistance between the metallization contact structure and the semiconductor substrate is from about $10^{-8}$ ohm·cm$^2$ to about $10^{-2}$ ohm·cm$^2$.

26. The metallization contact structure according to claim 22, wherein the patterned conductive contact layer is made of a metal, wherein the metal is selected from the group consisting of Ni, Co, Ti, Mo, Ta and W.

27. A method for patterning a layer comprising:
   depositing a layer directly on a substrate;
   depositing a metal bearing ink directly onto a portion of the layer, wherein exposed portions of the layer are adjacent to the metal bearing ink;
   patterning the layer by removing the exposed portions of the layer from the substrate using the deposited metal bearing ink as a protective mask, wherein the patterning the layer by removing the exposed portions of the layer comprises a wet etching process comprising applying a wet chemical etchant to the substrate, wherein the wet chemical etchant removes the exposed portions of the layer from the substrate;
   wherein side edges of the layer are aligned along a plane with corresponding side edges of the metal bearing ink; and
   removing the metal bearing ink.

28. The method according to claim 27, wherein the layer to be patterned is a conductive layer made from metal.

29. The method according to claim 27, wherein the depositing the metal bearing ink further comprises screen printing, extrusion, pad printing, jet printing or dispensing the metal bearing ink onto the layer to be patterned.

30. A method to form a functional structure comprising:
   depositing a first layer of functional material directly on a substrate;
   depositing a second layer of functional material directly onto a portion of the first layer of functional material, wherein exposed portions of the first layer of functional material are adjacent to the second layer of functional material;
   patterning the first layer of functional material by removing the exposed portions of the first layer of functional material from the substrate using the deposited second layer of functional material as a protection mask, wherein the patterning the first layer of functional material comprises a wet etching process comprising applying a wet chemical etchant to the substrate, wherein the wet chemical etchant removes the exposed portions of the layer from the substrate;
   wherein side edges of the first layer are aligned along a plane with corresponding side edges of the second layer; and
   the second layer of functional material is remained on the substrate and becomes a part of the functional structure.

31. The method according to claim 30, wherein the first layer of functional material is a conductive layer made from metal.

32. The method according to claim 30, wherein the second layer of functional material is a metal bearing ink.

33. The method according to claim 32, wherein the depositing the metal bearing ink further comprises screen printing, extrusion, pad printing, jet printing or dispensing the metal bearing ink onto the layer to be patterned.

34. The method according to claim 30, wherein the method further comprises:

thermally processing the first layer of functional material and the second layer of functional material after removal of the exposed portion of the first layer of functional material.

35. The method according to claim 1, wherein the wet chemical etchant is ferric chloride.

36. The method according to claim 18, wherein the wet chemical etchant is ferric chloride.

* * * * *